(12) United States Patent
Chen et al.

(10) Patent No.: US 7,044,204 B2
(45) Date of Patent: May 16, 2006

(54) HEAT DISSIPATING DEVICE WITH FAN HOLDER

(75) Inventors: Chun-Chi Chen, Tu-Chen (TW); Meng Fu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/901,618

(22) Filed: Jul. 28, 2004

(65) Prior Publication Data

US 2005/0088819 A1    Apr. 28, 2005

(30) Foreign Application Priority Data

Oct. 28, 2003    (TW) .............................. 92219094 U

(51) Int. Cl.
*F24H 3/06* (2006.01)
(52) U.S. Cl. ..................... 165/122; 165/80.3; 361/697; 174/16.3; 257/722
(58) Field of Classification Search ............... 165/121, 165/122, 80.3; 361/697; 257/722; 174/16.3
See application file for complete search history.

(56) References Cited

U.S. PATENT DOCUMENTS

| 6,017,185 A | 1/2000 | Kuo |
| 6,118,657 A | 9/2000 | Clemens |
| 6,392,885 B1* | 5/2002 | Lee et al. .................... 361/697 |
| 6,637,502 B1* | 10/2003 | North et al. ................ 165/80.3 |
| 6,672,374 B1* | 1/2004 | Lin ............................ 165/121 |
| 6,712,130 B1* | 3/2004 | Lin ............................ 165/125 |
| 6,924,982 B1* | 8/2005 | Chen et al. .................. 361/697 |
| 2002/0139518 A1* | 10/2002 | Lee et al. .................... 165/121 |
| 2003/0137807 A1* | 7/2003 | Chen ........................... 361/697 |

* cited by examiner

*Primary Examiner*—Terrell McKinnon
(74) *Attorney, Agent, or Firm*—Wei Te Chung

(57) ABSTRACT

A heat dissipating device is adapted to remove heat from an electronic package. The heat dissipating device includes a heat sink (6), a fan (1) and a fan holder (2). The fan holder comprises a guiding receptacle (20) and a securing base (40) covering the heat sink. An inlet (24) of the guiding receptacle is coupled to the bottom of the fan. An opening (221) is defined in the guiding receptacle for providing airflow access from the fan to the heat sink.

14 Claims, 6 Drawing Sheets

HEAT DISSIPATING DEVICE WITH FAN HOLDER

BACKGROUND OF THE INVENTION

1. Field of the Invention

The present invention relates to a heat dissipating device, and particularly to a heat dissipating device with a fan holder guiding the airflow impelled by a fan.

2. Prior Art

Central processing unit (CPU) is the core administrator of electrical signals in most contemporary personal computers. Continued development of CPUs has enable them to perform more and more functions. Heat generated by CPUs has increased commensurately. Such heat can adversely affect the operational stability of computers. Measures must be taken to efficiently remove the heat from the CPU. Typically, a heat sink having great heat conductivity is mounted on the CPU to remove heat therefrom. A fan is often attached to the heat sink to provide forced air convection therefrom.

A conventional heat dissipation assembly as shown in FIG. 5 includes a fan 1 and a heat sink 3. The fan 1 defines four through holes 2 in four corners thereof. The heat sink 3 comprises a base 4, and a plurality of parallel fins 5 extending upwardly from the base 4. A plurality of screw threads 6 is formed in two outmost fins 5 at each side of the heat sink 3. Four screws 7 are received through the through holes 2 and engaged in the screw threads 6. However, the fins of the heat sink are normally relatively thin, and are prone to be deformed or damaged when the screws are engaged therewith. When this happens, the screws are easily loosened or even disengaged from the fins. When the fan is no longer securely mounted on the heat sink, the fan may operate less efficiently and cause noise.

A variety of fan holders have been developed for mounting a fan to a heat sink. One example is shown in FIG. 6. A fan holder 20 comprises a rectangular plate 26, four clasps 36 extending downwardly therefrom and four pins 28 extending upwardly therefrom. An opening 32 is defined in a middle of the plate 20 for providing airflow access from a fan 10 to a heat sink 40. The clasps 36 engage with hooks 48 of heat sink 40, thereby fastening the fan holder 20 to the heat sink 40. The pins 28 are received in through holes 12 of a frame of the fan 10. The fan is thereby securely mounted on top of the heat sink. However, the impeller 14 of the fan 10 dose not generate airflow. The part of the heat sink 40 under the impeller 14 of the fan 10 can not be blown by the fan 10. This significantly reduced the efficiency of the heat dissipation assembly.

SUMMARY OF THE INVENTION

Accordingly, an object of the present invention is to provide a heat dissipating device with a fan holder which can guide the airflow impelled by a fan to the heat sink.

To achieve the above-mentioned object, a heat dissipating device in accordance with the present invention comprises a heat sink, a fan and a fan holder. The fan holder comprises a guiding receptacle and a securing base covering the heat sink. The inlet of the guiding receptacle is coupled to the bottom of the fan. An opening is defined in the guiding receptacle for providing airflow access from the fan to the heat sink.

Other objects, advantages and novel features of the present invention will be drawn from the following detailed description of a preferred embodiment of the present invention with attached drawings, in which:

DETAILED DESCRIPTION OF THE INVENTION

Figure 1:
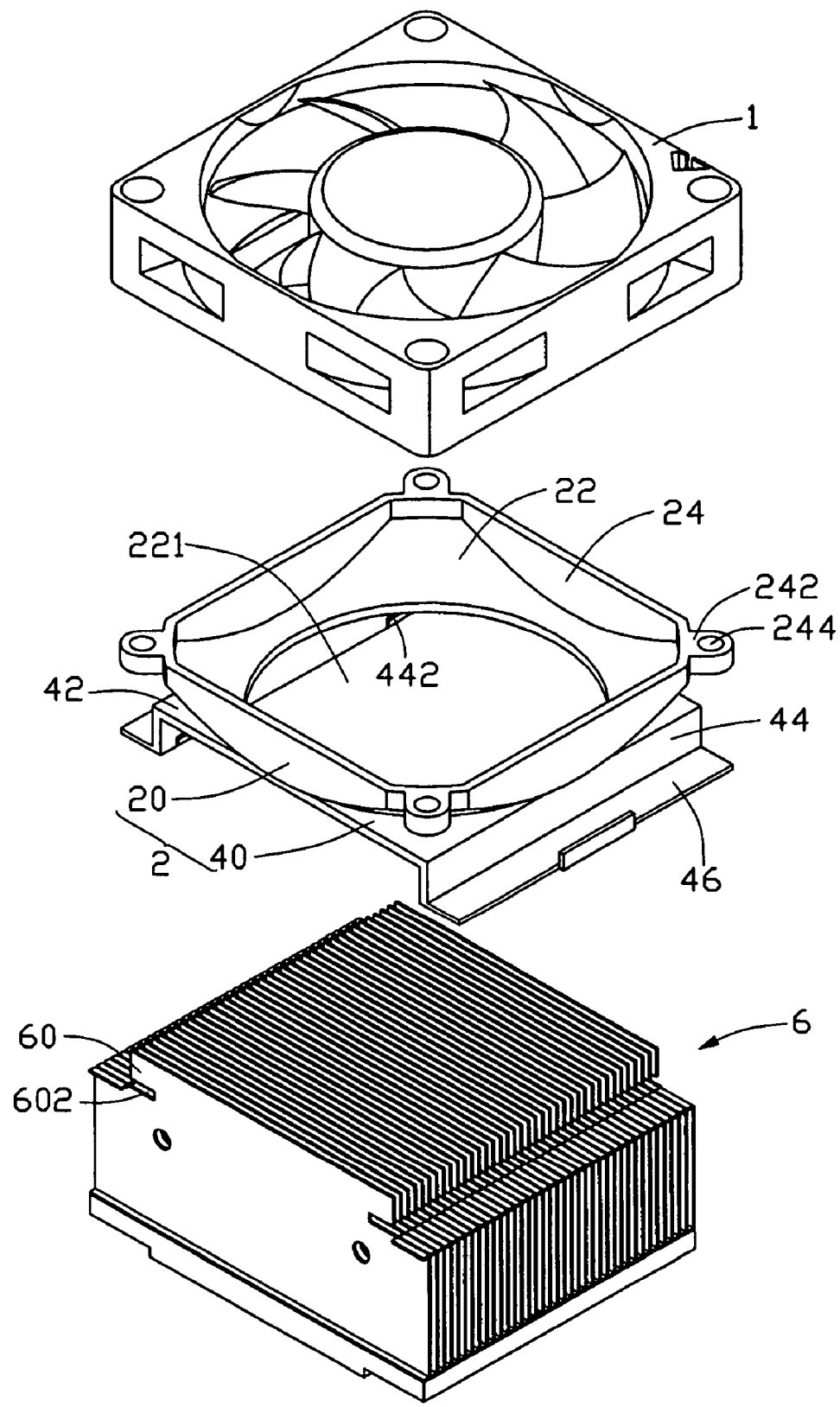
FIG. 1 is an exploded view of a heat dissipating device in accordance with a preferred embodiment of the present invention.
Figure 2:
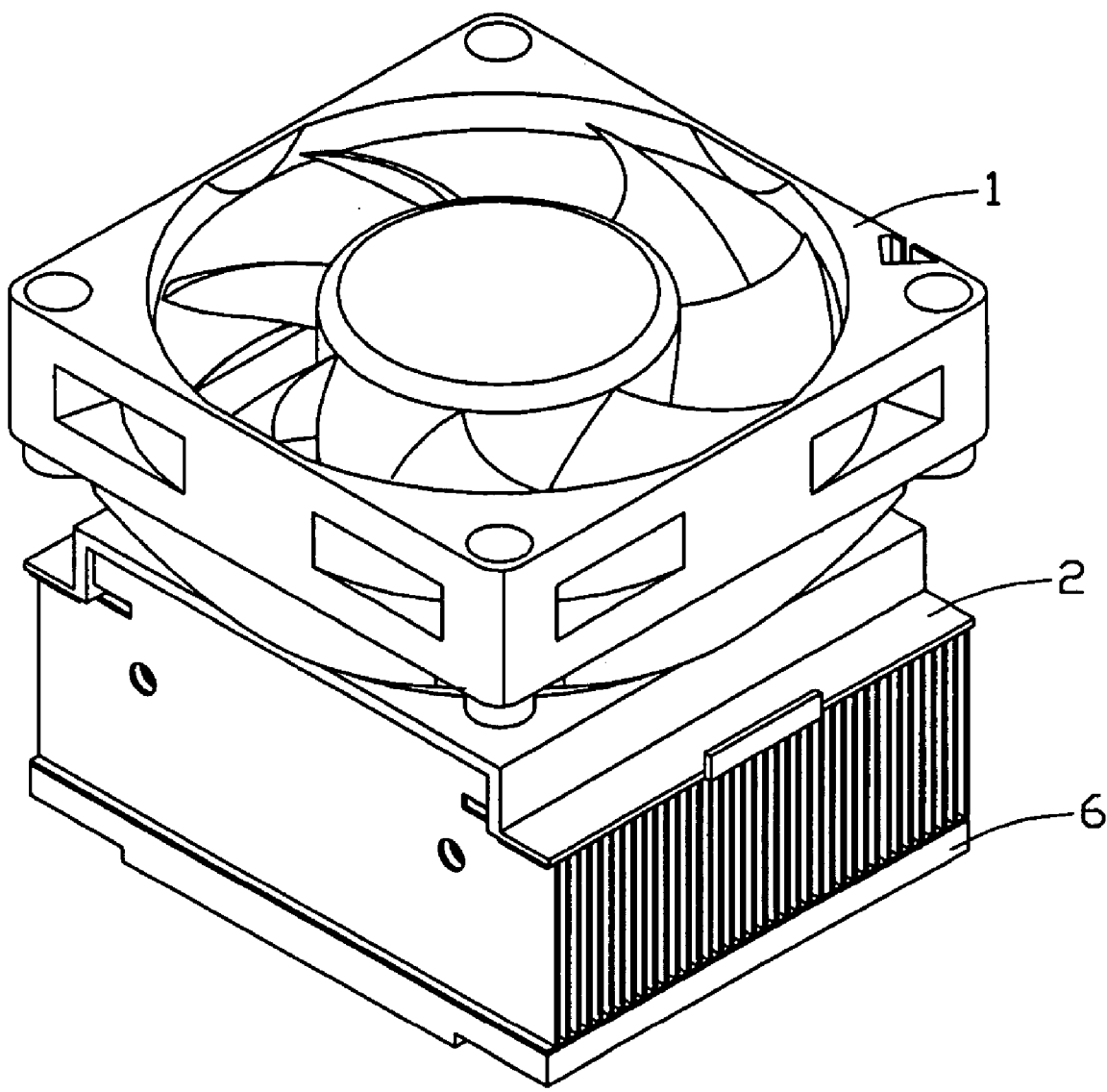
FIG. 2 is an assembled view of the heat dissipating device in FIG. 1.
Figure 3:
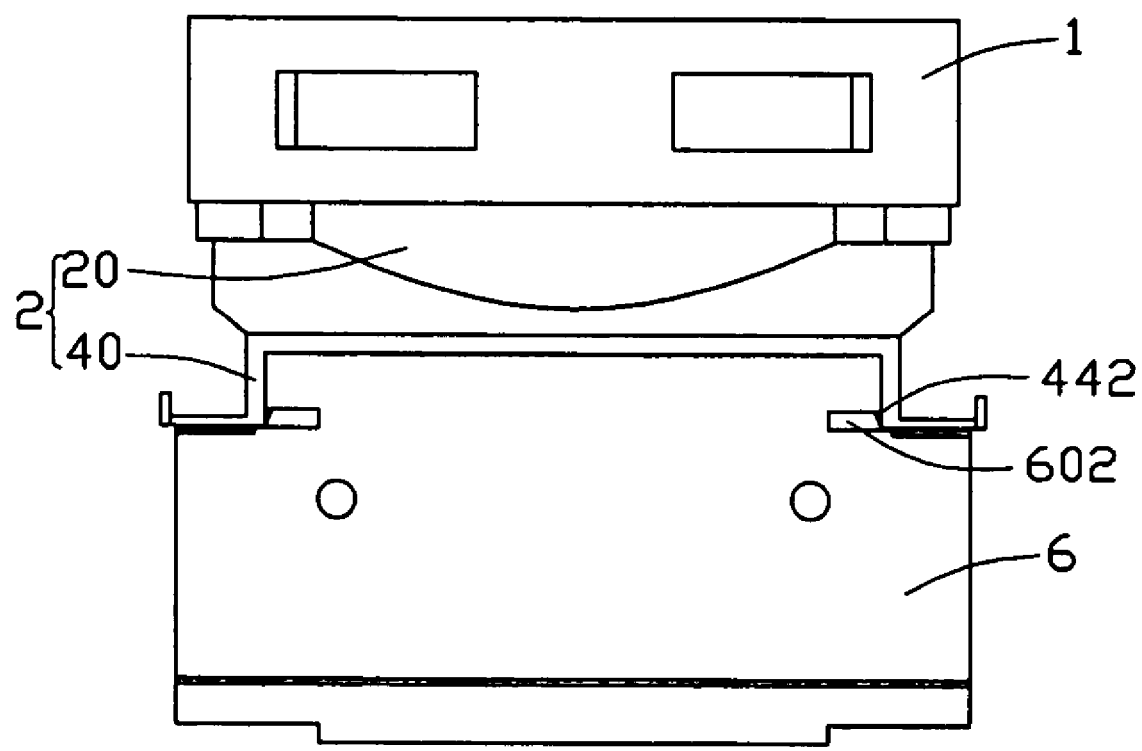
FIG. 3 is a side elevational view of a heat dissipating device in FIG. 2.

Referring to FIG. 1 to FIG. 3, a heat dissipating device in accordance with the preferred embodiment of the present invention comprises a fan 1, a fan holder 2 and a heat sink 6. The heat dissipating device is adapted for removing heat from an electronic package (not shown) thereunder.

The fan 1 has a rectangular frame with four through holes defined at the four corners thereof. An impeller is defined at the center and a plurality of blades are radially mounted thereon.

The fan holder 2 has an air guiding receptacle 20 and a securing base 40. The guiding receptacle 20 is generally bowl-shaped. An opening 221 is defined at the bottom of the guiding receptacle 20, for providing airflow access from the fan 1 to the heat sink 6. The inlet 24 of the guiding receptacle 20 is rectangular, with four straight walls extending from the body of the guiding receptacle 20. A tab 242 is formed at each corner of the inlet 24 of the guiding receptacle 20, with a hole 244 defined thereon.

Figure 4:
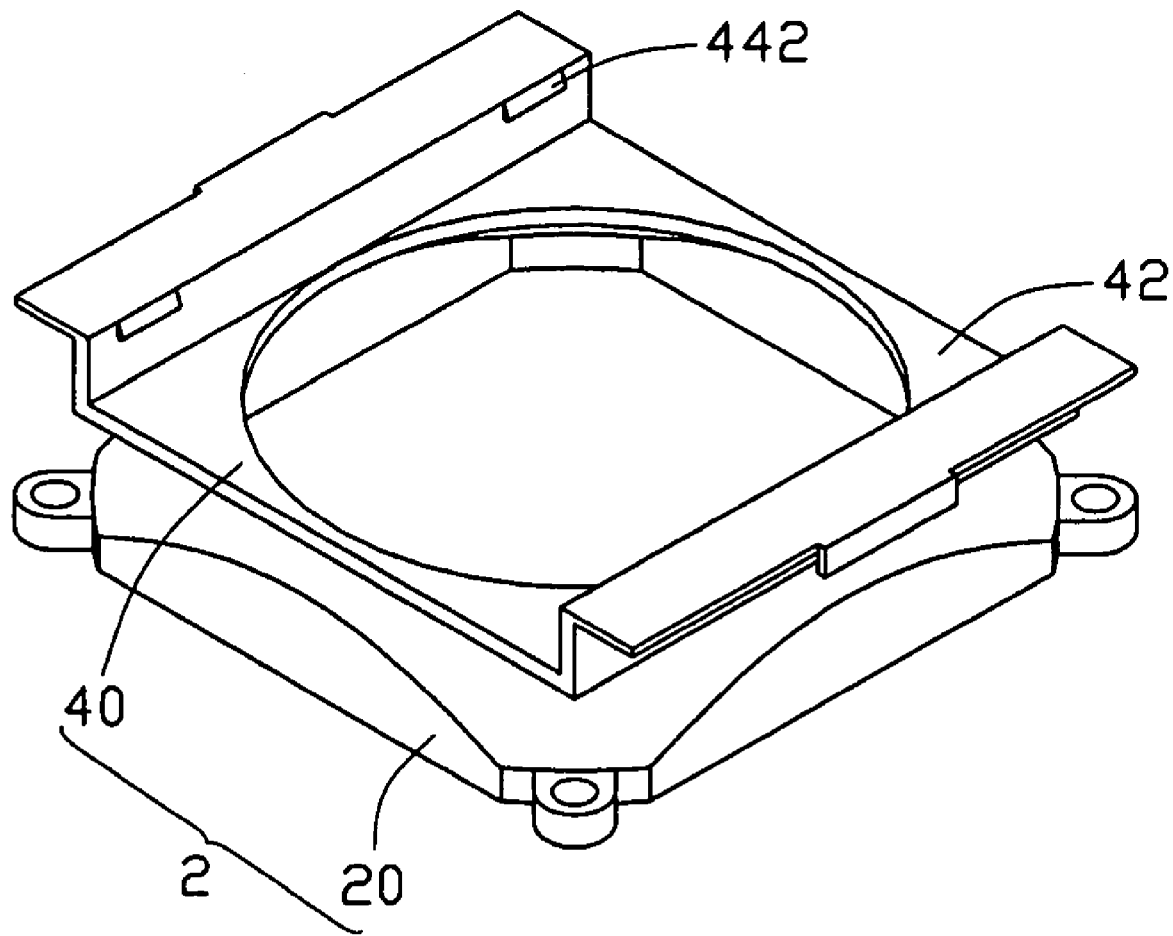
FIG. 4 is an isometric view of a fan holder of the heat dissipating device in FIG. 1.
Figure 5:
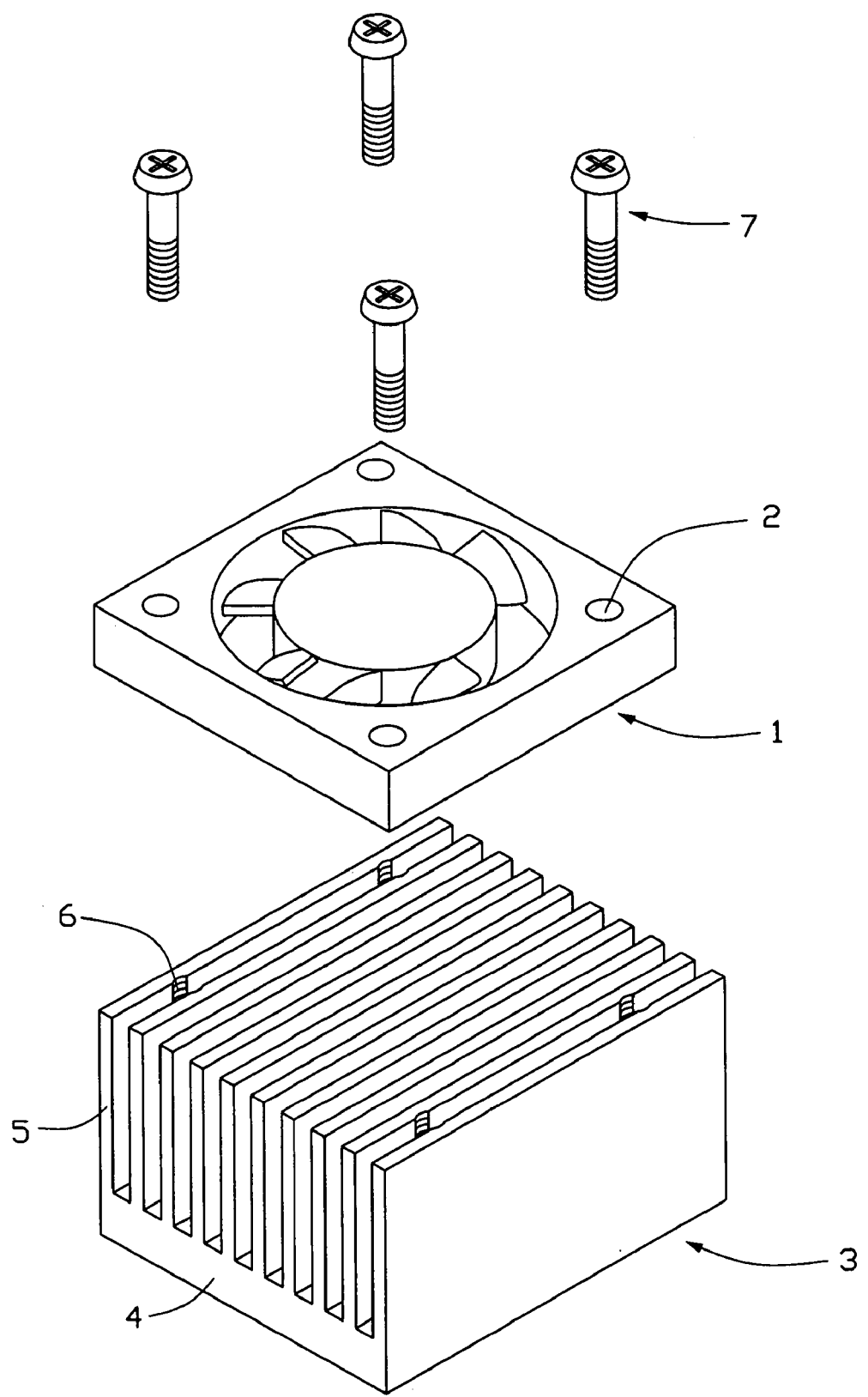
FIG. 5 is an isometric view of a conventional heat dissipating device.
Figure 6:
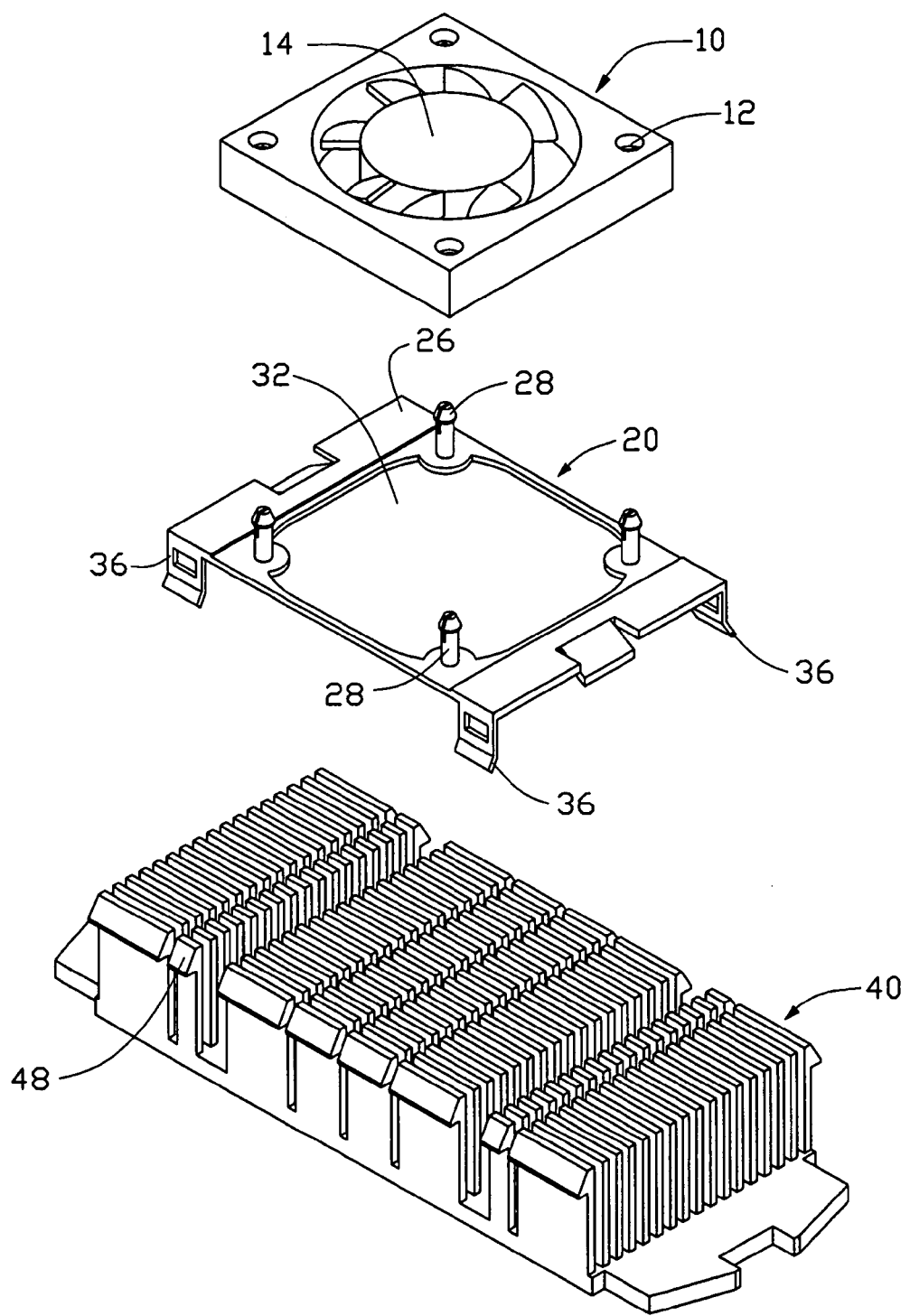
FIG. 6 is an isometric view of another conventional heat dissipating device.

Referring also to FIG. 4, the securing base 40 has a rectangular top plate 42, which is contiguous to the guiding receptacle 20. A pair of side walls 44 extends parallel downwards from opposite sides of the top plate 42. Each side wall 44 further extends horizontally to form a pressing portion 46 for clip (not shown) supported thereon. A pair of barbs 442 is formed at the foot of each side wall 44. Each pair of barbs 442 is disposed at respective opposite ends of the respective side wall 44.

The heat sink 6 has a base and a plurality of fins extending therefrom. A platform 60 is formed at the top of the heat sink 6. Opposite grooves 602 are defined at foot of the platform 60.

In assembly, the inlet 24 of the guiding receptacle 20 of the fan holder 2 is coupled to the bottom of the fan 1, with screws (not shown) received through the through holes of the fan 1 and the holes 244 of the fan holder 2. Then, the assembly of the fan 1 and the fan holder 2 is secured to the heat sink 6, with the securing base 40 covering the platform 60 and the barbs 442 engaging with the grooves 602.

In the present invention, the fan 1 is spaced from the heat sink 6 by the fan holder. The airflow impelled by the fan 1 is guided by the fan holder, so that the central part of the heat sink 6 under the impeller of the fan 1 can be blown by the fan 1. The heat generated by the electronic package (not shown) can be removed more efficiently than the conventional heat dissipating device.

It is understood that the invention may be embodied in other forms without departing from the spirit thereof. Thus, the present example and embodiment t is to be considered in

What is claimed is:

1. A heat dissipating device for removing heat from an electronic package, comprising:
   a heat sink;
   a fan for generating airflow; and
   a fan holder spacing the fan and the heat sink, the fan holder comprising:
   a securing base covering the heat sink, the securing base of the fan holder having a top plate and a pair of parallel side walls extending from opposite sides of the top plate; and
   a guiding receptacle, the inlet of the guiding receptacle coupled to the bottom of the fan, an opening defined in the guiding receptacle for providing airflow access from the fan to the heat sink.

2. The heat dissipating device as claimed in claim 1, wherein the guiding receptacle of the fan holder is generally bowl-shaped.

3. The heat dissipating device as claimed in claim 1, wherein the inlet of the guiding receptacle is rectangular, with four straight walls extending from the body of the guiding receptacle.

4. The heat dissipating device as claimed in claim 3, wherein a tab is formed at each corner of the inlet of the guiding receptacle with a bole defined thereon.

5. The heat dissipating device as claimed in claim 1, wherein a pair of barbs is formed at foot of each side wall of the securing base.

6. The heat dissipating device as claimed in claim 1, wherein each side wall further extends horizontally to form a pressing portion.

7. The heat dissipating device as claimed in claim 1, wherein a platform is formed at the top of the heat sink.

8. The heat dissipating device as claimed in claim 7, wherein a pair of grooves is defined at opposite feet of the platform.

9. A fan holder for securing a fan to a heat sink, comprising a guiding receptacle and a securing base adapted to cover the heat sink, the guiding receptacle spacing the fan and the heat sink, the receptacle having an inlet adapted to couple to the bottom of the fan, an opening defined in the guiding receptacle for providing airflow access from the fan to the heat sink, wherein the securing base of the fan holder has a top plate and a pair of parallel side walls extending from opposite sides of the top plate.

10. The fan holder as claimed in claim 9, wherein the guiding receptacle of the fan holder is generally bowl-shaped.

11. The fan holder as claimed in claim 9, wherein the inlet of the guiding receptacle is rectangular, with four straight walls extending from the body of the guiding receptacle.

12. The fan holder as claimed in claim 11, wherein a tab is formed at each corner of the inlet of the guiding receptacle with a hole defined thereon.

13. The fan holder as claimed in claim 9 wherein a pair of barbs is formed at foot of each side wall of the securing base.

14. The fan holder as claimed in claim 9 wherein each side wall further extends horizontally to form a pressing portion.

* * * * *